United States Patent
Yang et al.

(10) Patent No.: US 11,493,579 B2
(45) Date of Patent: Nov. 8, 2022

(54) MULTI-TUNE MAGNETIC RESONANCE IMAGING (MRI) COIL USING DIFFERENT MATCHING IMPEDANCES

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 311 days.

(21) Appl. No.: 16/573,237

(22) Filed: Sep. 17, 2019

(65) Prior Publication Data
US 2020/0096584 A1 Mar. 26, 2020

Related U.S. Application Data

(60) Provisional application No. 62/735,348, filed on Sep. 24, 2018.

(51) Int. Cl.
*G01R 33/36* (2006.01)
*G01R 33/34* (2006.01)

(52) U.S. Cl.
CPC ......... *G01R 33/3635* (2013.01); *G01R 33/34* (2013.01); *G01R 33/3685* (2013.01)

(58) Field of Classification Search
CPC . G01R 33/34; G01R 33/3635; G01R 33/3685
See application file for complete search history.

(56) References Cited

U.S. PATENT DOCUMENTS

| | | | |
|---|---|---|---|
| 4,742,304 A * | 5/1988 | Schnall | G01R 33/3635 324/318 |
| 4,825,162 A | 4/1989 | Roemer et al. | |
| 5,166,621 A | 11/1992 | Codrington et al. | |
| 2008/0111548 A1* | 5/2008 | Yamamoto | G01R 33/34046 324/322 |

(Continued)

OTHER PUBLICATIONS

Fitzsimmons J R, Brooker HR, Beck B., "A transformer-coupled double-resonant probe for NMR imaging and spectroscopy", Magn Reson Med 1987; 5(5):471-477.

(Continued)

*Primary Examiner* — Rishi R Patel
(74) *Attorney, Agent, or Firm* — Eschweiler & Potashnik, LLC

(57) ABSTRACT

Embodiments relate to MRI RF multi-tune coil elements, arrays, and MRI systems comprising such elements. One example embodiment comprises: a LC coil comprising one or more matching points; and two or more matching branches, each of which connected to the LC coil at matching point of the one or more matching points that is associated with that matching branch, wherein each matching branch comprises an associated set of one or more RF traps configured to block each frequency of two or more frequencies other than a frequency associated with that matching branch, and wherein each matching branch is configured to match to an associated predetermined impedance at the frequency associated with that matching branch.

20 Claims, 9 Drawing Sheets

(56) References Cited

U.S. PATENT DOCUMENTS

| | | | |
|---|---|---|---|
| 2009/0121718 A1* | 5/2009 | Yamamoto | G01R 33/3806 324/322 |
| 2012/0112748 A1* | 5/2012 | Hetherington | G01R 33/3635 324/318 |
| 2012/0242338 A1* | 9/2012 | Freytag | G01R 33/3635 324/322 |
| 2018/0252783 A1* | 9/2018 | Jones | G01R 33/3657 |

OTHER PUBLICATIONS

Gerald B. Matson et al., "A Practical Double-Tuned 1H/31P Quadrature Birdcage Headcoil Optimized for 31P Operation", Magn. Reson. Med. 1999, 42, 173-182.

Joseph, P. M., et al., "Two Configurations of the Four-Ring Birdcage Coil for 1H Imaging and 1H-Decoupled 31P Spectroscopy of the Human Head", Journal of Magnetic Resonance, Series B, vol. 103, Issue 2, Feb. 1994, pp. 103-114.

\* cited by examiner

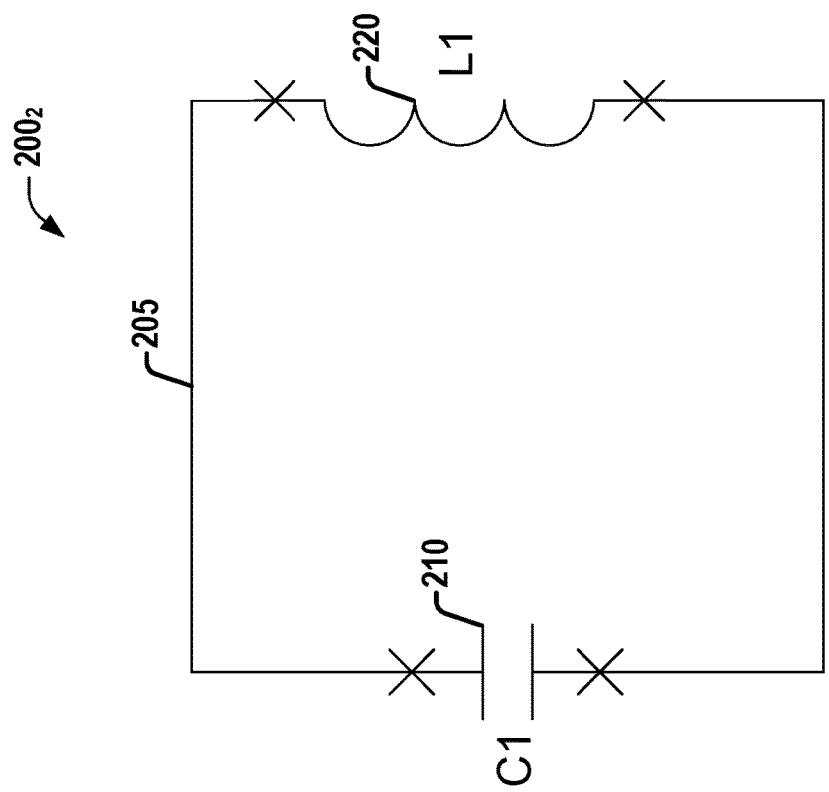
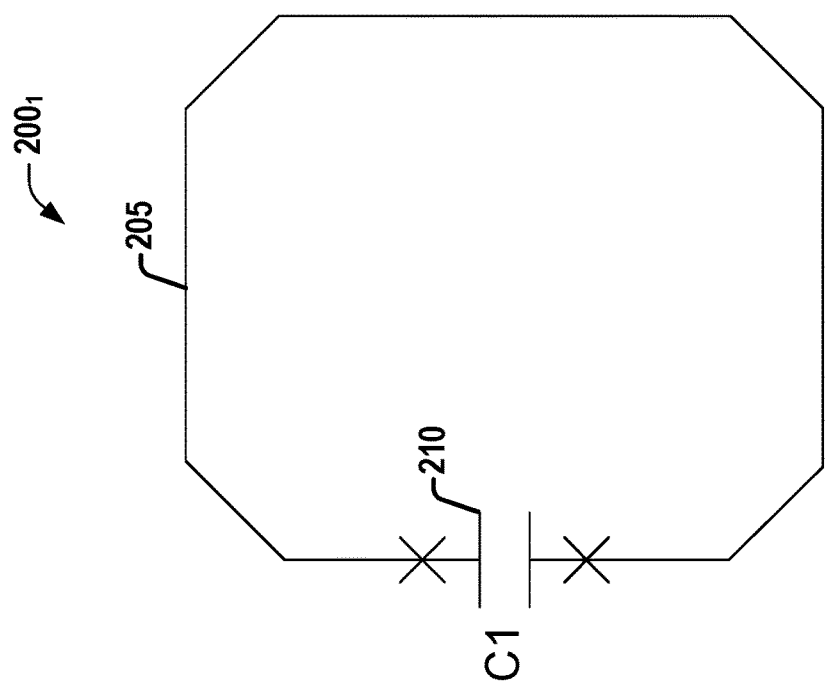
FIG. 2

MULTI-TUNE MAGNETIC RESONANCE IMAGING (MRI) COIL USING DIFFERENT MATCHING IMPEDANCES

REFERENCE TO RELATED APPLICATIONS

This application claims the benefit of U.S. Provisional Patent Applications No. 62/735,348 filed Sep. 24, 2018, entitled "MULTI-TUNE MAGNETIC RESONANCE IMAGING (MRI) COIL USING DIFFERENT MATCHING IMPEDANCES", the contents of which are herein incorporated by reference in their entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of an RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1$H nuclei)$\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

BRIEF DESCRIPTION OF THE DRAWINGS

FIG. 2 is a pair of diagrams illustrating a single-tune coil in connection with various aspects discussed herein

DETAILED DESCRIPTION

Figure 1:
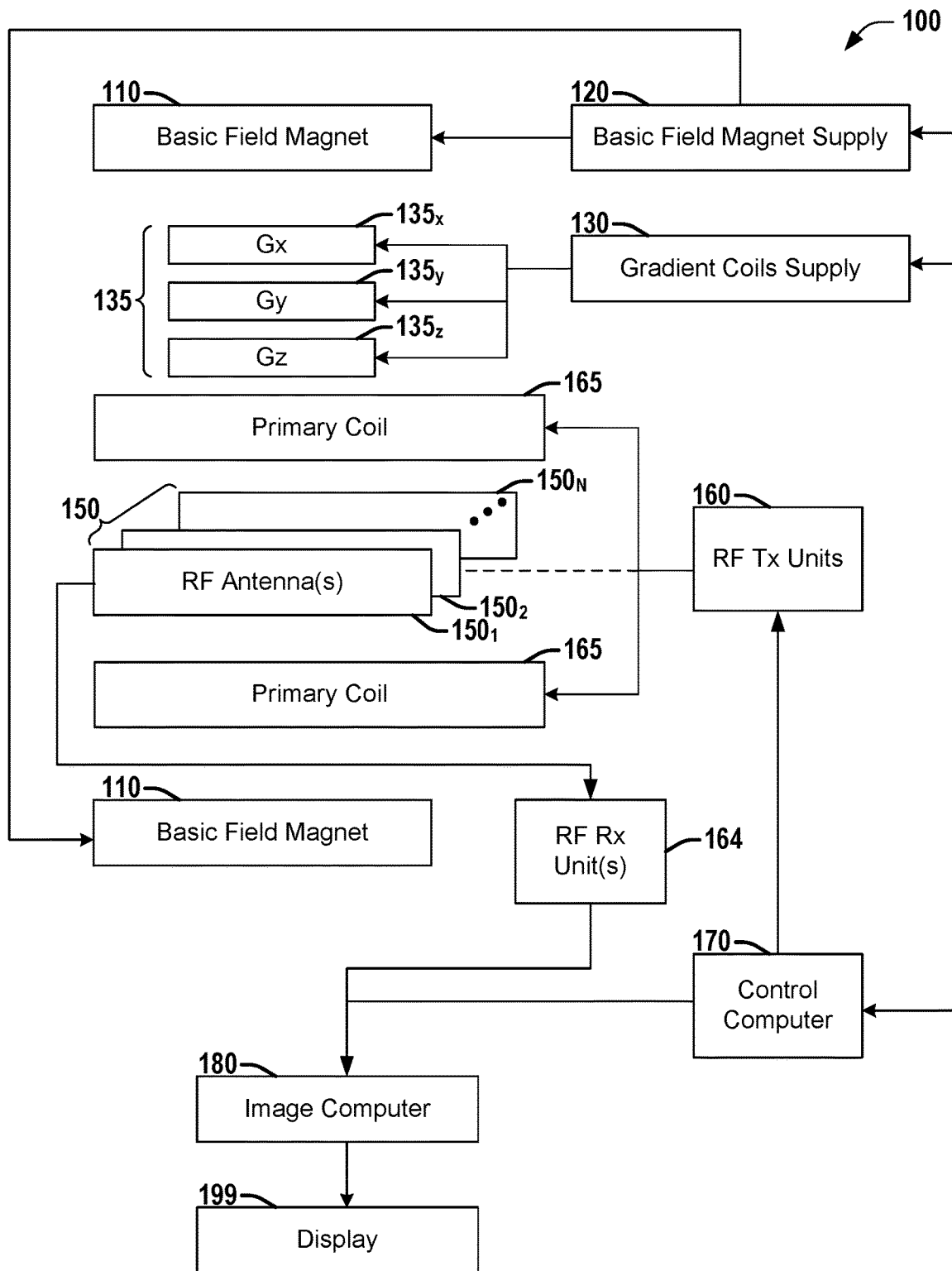
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

The present disclosure will now be described with reference to the attached drawing figures, wherein like reference numerals are used to refer to like elements throughout, and wherein the illustrated structures and devices are not necessarily drawn to scale.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet (s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during an MRI procedure.

MRI apparatus 100 can include a primary coil 165 configured to generate RF pulses. The primary coil 165 can be a whole body coil (WBC). The primary coil 165 can be, for example, a birdcage coil. The primary coil 165 can be controlled, at least in part, by a RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and/or to receive resulting magnetic resonance signals from an object to which the RF pulses are directed. A RF antenna 150 configured solely to generate RF pulses can be referred to herein as a transmit (or Tx) antenna (or coil or coil array), while a RF antenna 150 configured solely to receive resulting magnetic resonance signals from an object to which the RF pulses are directed can be referred to herein as a receive (or Rx) antenna (or coil or coil array), and a RF antenna 150 configured to both generate RF pulses and receive resulting magnetic resonance signals can be referred to herein as a transmit/receive (or Tx/Rx) antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with a RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

An MRI apparatus can include, among other components, a controller (e.g., control computer 170) and a RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

Most MRI scans are proton ($^1$H) imaging, due to the tremendous number of protons in the human body. Proton MRI provides significant structural information regarding tissue density and fluid flow. Besides protons, there are many other nuclei in the human body (referred to herein as X-nuclei), such as $^{31}$P, $^{23}$Na, $^{13}$C, $^{19}$F, etc. Those X-nuclei can also be MR scanned and can provide additional functional information, such as metabolism, etc. It can be advantageous to have a MRI coil which can perform proton MR imaging for position registering plus MR imaging of at least one additional X-nuclei for functional information. This kind of MRI coil (that can perform MR imaging of two or more distinct nuclei) is called a multi-tune coil. However, due to the significantly smaller number of X-nuclei in the human body plus the smaller gyromagnetic ratio, the X-nuclei signal level is much less than that of the proton signal level, and can often be at least one thousand times less. Therefore, one major goal for a multi-tune coil is to optimize the X-nuclei signal for the best possible SNR in the coil design. In existing systems, during optimization of the X-nuclei SNR, the proton SNR may be compromised. In contrast to existing systems, various embodiments can employ techniques discussed herein to optimize both X-nuclei signals and proton signal.

Four methods of constructing multi-tune coils have been employed in existing systems.

Figure 3:
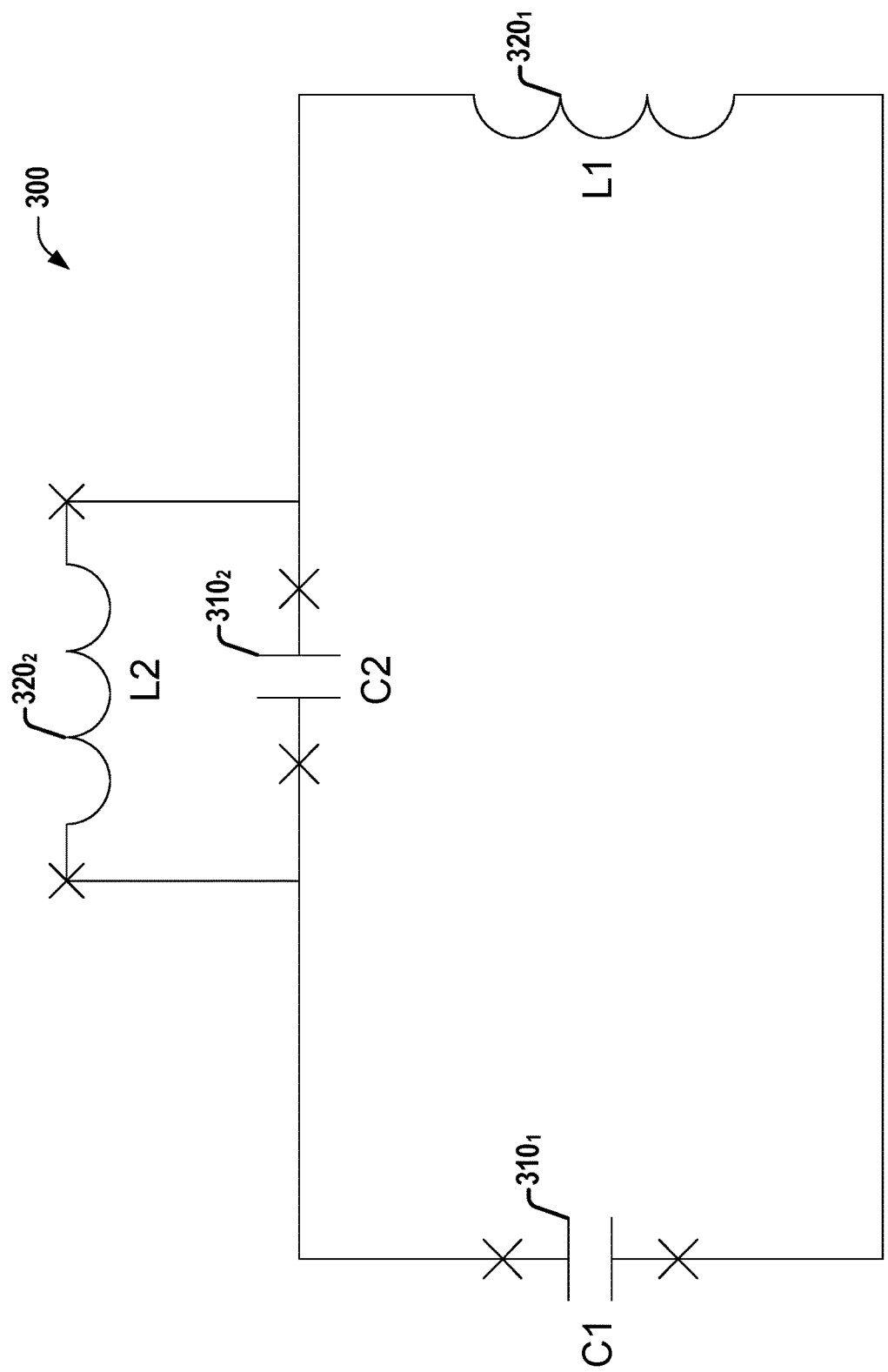
FIG. 3 is a diagram illustrating an example dual-tune coil designed via the pole insertion approach, in connection with various aspects discussed herein.

The first method is the pole insertion approach. Referring to FIG. 2, illustrated is a pair of diagrams of a single-tune coil in connection with various aspects discussed herein. Capacitor 210 (e.g., with capacitance C1) in diagram $200_1$ is the breaking point capacitor of the coil. The thick connection between the two leads of capacitor 210 is the coil copper trace 205 which has an inductance (e.g., L1) represented by the inductor 220 in diagram $200_2$. The coil of FIG. 1 only has one resonant frequency, which is $1/2\pi\sqrt{L1*C1}$. Referring to FIG. 3, illustrated is an example dual-tune coil 300 designed via the pole insertion approach, in connection with various aspects discussed herein. Dual-tune coil 300 can be obtained via inserting a pole (comprising capacitor $310_2$ (e.g., with capacitance C2) in parallel with inductor $320_2$ (e.g., with inductance L2)) into the single-tune coil of FIG. 2 (comprising capacitor $310_1$ (e.g., with capacitance C1) and inductor $320_1$ (e.g., with inductance L1)). The pole splits the single frequency to two frequencies, because the pole acts like an inductor at frequencies lower than the pole frequency (L2 and C2) and acts like a capacitor at frequencies higher than pole frequency. Because there is current flowing in inductor $320_2$, yet inductor $320_2$ is not contributing to MRI signal capturing and has resistive loss, i.e., additional noise, and only inductor $320_1$ is capturing MRI signal, the SNR for both frequencies is lowered. This is the major disadvantage of the pole method.

Figure 4:
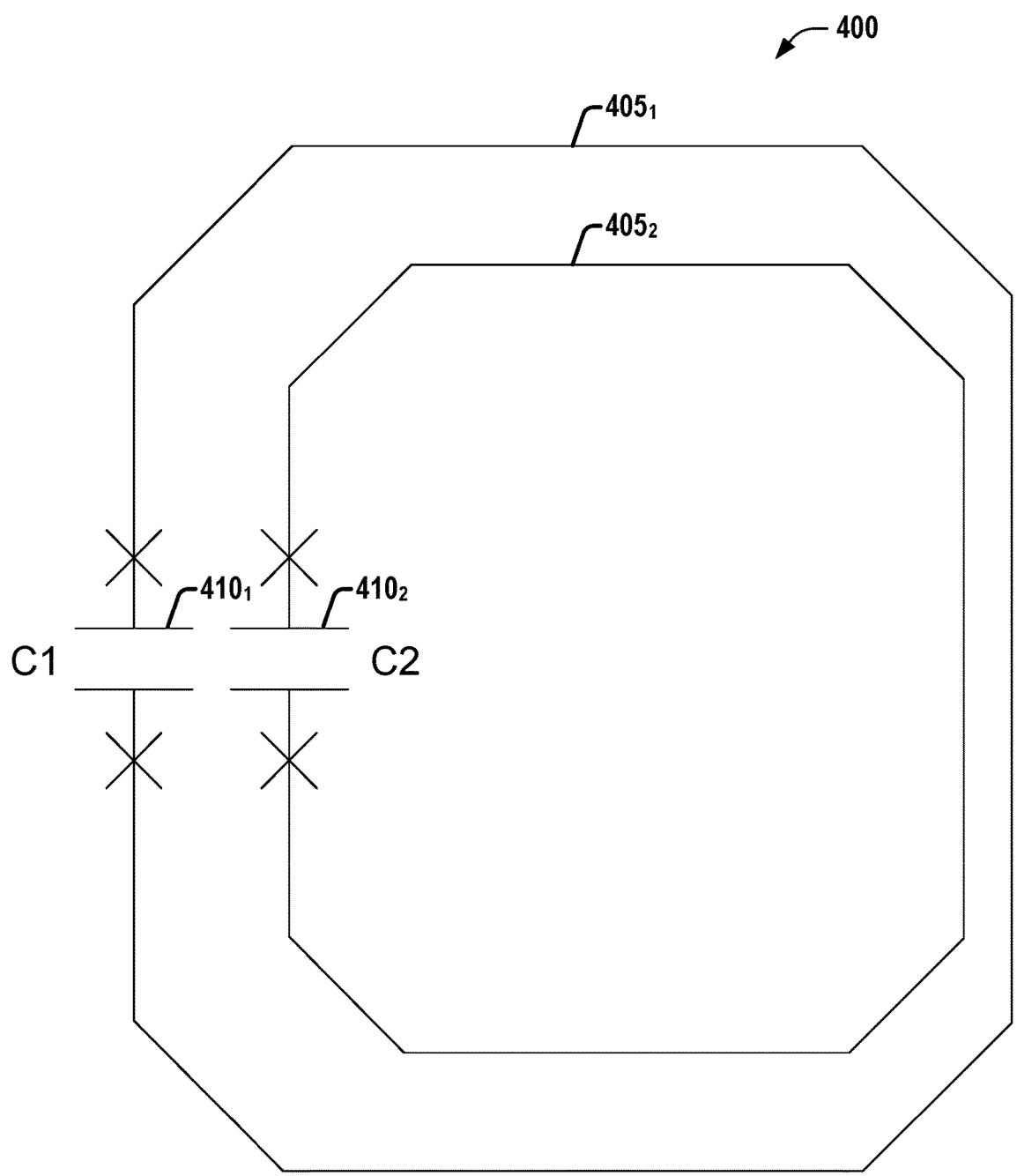
FIG. 4 is a diagram illustrating an example dual-tune coil designed via the nested approach, in connection with various aspects discussed herein.

The second method is to use the nest method or mutual inductance method. Referring to FIG. 4, illustrated is an example dual-tune coil 400 designed via the nested approach, in connection with various aspects discussed herein. The second method involves arranging two coils concentrically. Normally the smaller coil (comprising trace $405_2$ and capacitor $410_2$) is tuned to the higher frequency (for $^1$H) and the larger coil (comprising trace $405_1$ and capacitor $410_1$) is tuned to the lower frequency (for the X-nuclei). To the smaller coil, the larger coil looks inductive, and thus acts like a shield. To the larger coil, the smaller coil looks capacitive and thus looks like an open situation. For the second method, the X-nuclei coil doesn't lose much SNR, because the induced current through the proton coil is not large even though the current through trace $405_2$ is still a part of the coil resonance. Thus, the second method is better than pole method regarding SNR. However, one issue with the second method is that the X-nuclei coil size needs to be slightly bigger, and will thereby lose a little bit of SNR on the shallow area. Alternatively, the order of the two coils can be exchanged, such that the smaller coil has the lower frequency and the larger has the higher frequency. For this configuration, a trap circuit is required for the smaller coil to block the higher frequency current flow, which will lower the SNR for the smaller coil.

A similar approach is a dual tune coil using the mutual inductance between two coils. If both coils are tuned to the same frequency, the frequency will split into two frequencies because of the strong mutual inductance between two coils. The lower frequency has current flowing in the same direction in both coils. The higher frequency has current flowing in the opposite direction in both coils. If the mutual inductance is carefully chosen, then the lower frequency can be the X-nuclei frequency and the higher frequency can be the proton frequency.

Lastly, there is a special configuration for either the nested method or the mutual inductance method, wherein the two coils are perpendicular to each other so that their mutual inductance is trivial. For this case, both coils have freedom for frequency and no SNR is sacrificed. However, this perpendicular condition is very difficult to realize for more than two channels and it is difficult to have quadrature detection for either frequency due to limited channels.

Figure 5:
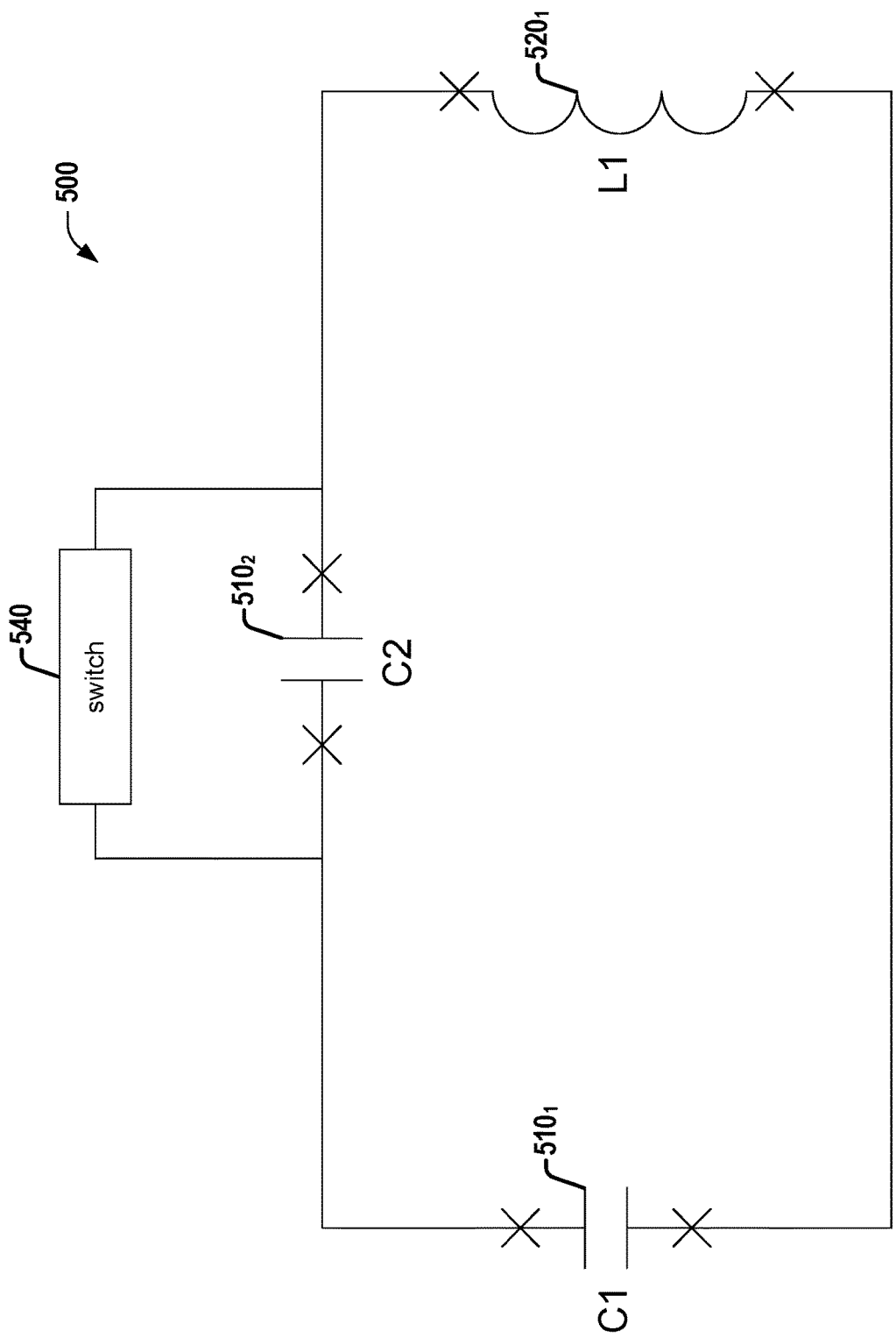
FIG. 5 is a diagram illustrating an example dual-tune coil comprising a switch to change frequencies, in connection with various aspects discussed herein.

The third method is to use a switch. Referring to FIG. 5, illustrated is a diagram of an example dual-tune coil 500 comprising a switch 540 to change frequencies, in connection with various aspects discussed herein. The switch 540 can be a mechanical or electrical (e.g., PIN diode) switch. When switch 540 is ON (short), capacitor $510_2$ (e.g., with capacitance C2) is not part of the resonant circuit. When switch 540 is OFF (open), capacitor $510_2$ is part of the resonant circuit. There are many ways to implement the switch method, but in each, the presence of the switch 540 creates two different states (frequencies), which is how this method works. However, switch 540 has additional loss and guarantees that the coil 500 cannot work simultaneously at both frequencies.

The fourth method includes special methods especially for birdcage resonators, such as the alternate rung method and the four-ring double resonant birdcage method. Because these methods only apply to birdcage coils and do not related to loop or saddle coils, and thus is not discussed further here.

In contrast to existing systems, various embodiments discussed herein can employ techniques discussed herein to facilitate matching coil(s) to different impedance(s) to realize multiple-tune coil(s). Various embodiments can be employed (e.g., as a RF antenna 150) as a transmitter, receiver, and/or multi array coil.

Figure 6:
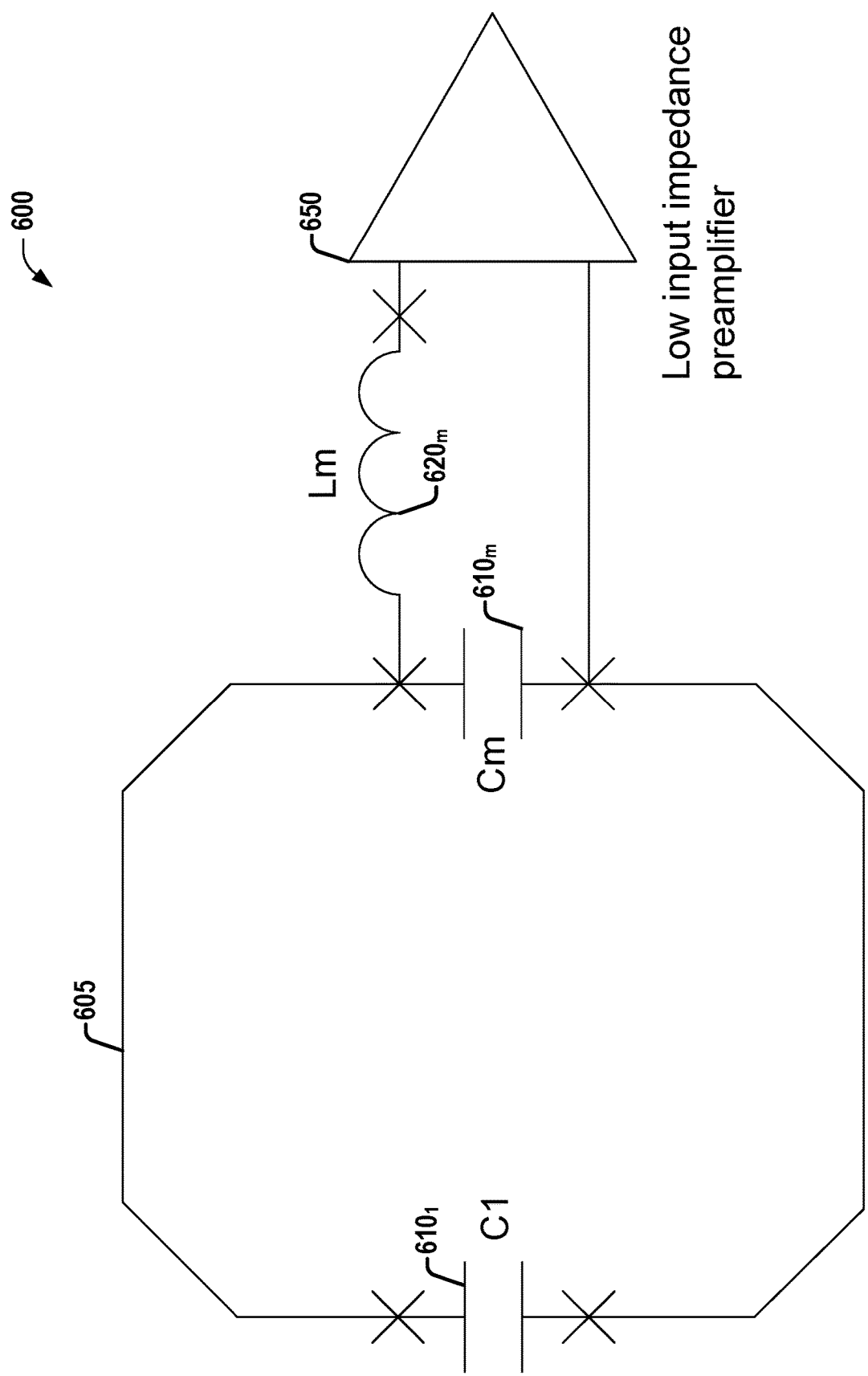
FIG. 6 is a diagram illustrating an example coil element (e.g., for an associated channel) of an array coil, in connection with various aspects discussed herein.

Referring to FIG. 6, illustrated is a block diagram of an example coil element (e.g., for an associated channel) 600 of an array coil, in connection with various aspects discussed herein. The following is an overview of the operation of an array coil. Capacitor $610_1$ (e.g., with capacitance C1) is the breaking point capacitor which resonates with the coil inductance (e.g., from a copper trace 605, etc.). Matching capacitor $610_m$ (e.g., with capacitance Cm) and matching inductor $620_m$ (e.g., with inductance Lm) transform the coil impedance from a low impedance to a designated impedance $Z_0$ for noise matching of a low input impedance preamplifier 650 (e.g., 50 Ohm). Low input impedance preamplifier 650 has a low input impedance, which can be considered as a short. Matching capacitor $610_m$ and matching inductor $620_m$ resonate with each other at the working frequency. Thus, the short from preamplifier 650 enables high impedance across capacitor $610_m$ to block any induced current from flowing.

Figure 7:
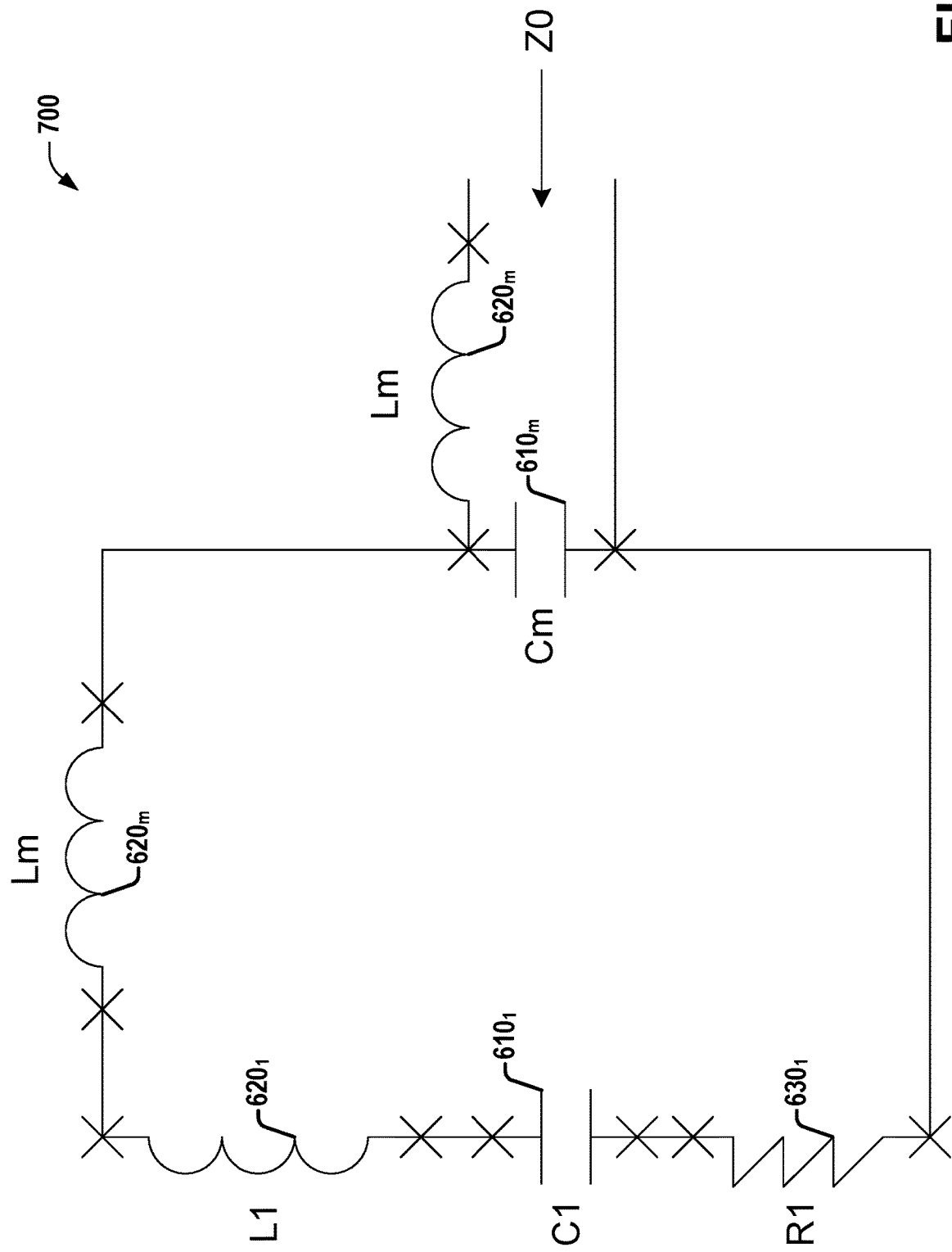
FIG. 7 is a diagram illustrating an equivalent schematic circuit of the example coil element of FIG. 6, in connection with various aspects discussed herein.

Referring to FIG. 7, illustrated is the equivalent schematic circuit 700 for circuit analysis of the example col element of FIG. 6, in connection with various aspects discussed herein. In FIG. 7, capacitor $610_1$ (e.g., with capacitance C1) is the breaking point capacitor, inductor $620_1$ (e.g., with inductance L1) is the coil inductor that resonates with capacitor $610_1$ at the working frequency, and the left inductor $620_m$ (e.g., with inductance Lm) is the part of the coil trace inductor (605) that facilitates matching. Capacitor $610_m$ and the right inductor $620_m$ in FIG. 7 are same as capacitor $610_m$ and inductor $620_m$ discussed above in connection with FIG. 6. Resistor $630_1$ (e.g., with resistance R1) is the coil loss of the coil element which includes conductor loss, capacitor loss, phantom loss and radiation loss. In FIG. 7, both inductor $620_1$ and the left inductor $620_m$ are part of coil element conductive trace 605. The sum of Lm and L1 is fixed and is the total inductance of the coil element 605. From the matching viewpoint the left inductor $620_m$, capacitor $610_m$, and the right inductor $620_m$ on the right create a quarter wavelength transmission line with an impedance of Zm, that is, $$j\omega_0 Lm \text{ or } -\frac{j}{\omega_0 C_m}$$

at the working frequency $\omega_o$. Since capacitor $610_1$ and inductor $620_1$ resonate with each other at the working frequency, their impedances cancel each other at the working frequency. The left inductor $620_m$, capacitor $610_m$, and the right inductor $620_m$ transform R1 to Z0. Thus, per equation (2):

$$Z_m^2 = Z_0 * R_1 \quad (2)$$

Since L1+Lm is the total inductance of coil trace 605 (which is fixed), this total inductance is defined as L=L1+Lm, and the working frequency is given by equation (3):

$$\omega_0 = \frac{\sqrt{Z_0 R_1} \, C_1 + \sqrt{Z_0 R_1 C_1^2 + 4 C_1 L}}{2 C_1 L} \quad (3)$$

In equation (3), R1, C1, and L can be considered fixed, as they are determined by the copper trace layout and what capacitor value C1 is used in capacitor $610_1$. Equation (3) shows that the resonant frequency is a function of the matching impedance Z0. Thus, in various embodiments, a different resonant frequency can be obtained by selecting a different matching impedance Z0. If Z0 increases, the working frequency also increases. Thus, in various embodiments, a multi-tune coil (e.g., with two or more working frequencies f1, f2, f3, etc.) can be designed by choosing (per equation (3)) the appropriate matching impedance (e.g., Z01, Z02, Z03, etc.) to obtain a given frequency using the same coil, without the inclusion of a pole, another coil, or a switch, unlike existing systems. The matching values Cm and Lm for each frequency (e.g., Cm1 and Lm1 for f1, Cm2 and Lm2 for f2, etc.) can be derived from equation (2). Various embodiments can avoid resonant current flowing in non-signal contributing inductors, in contrast to the pole method and nested method employed in existing systems. Embodiments discussed herein can comprise RF trap(s) to block different frequencies (e.g., f2, f3, etc.) so that the RF signal can be extracted (for Rx) and/or be fed (for Tx) at the appropriate frequency (e.g., f1). However, since the RF trap(s) of various embodiments are in matching circuit(s), the impact of the RF trap(s) on SNR is minor compared to the resonant circuit, although there is a small loss in the RF trap(s). Additionally, various embodiments can support all frequencies working simultaneously, and can (depending on the embodiment) operate in either or both of Tx or Rx modes.

Figure 8:
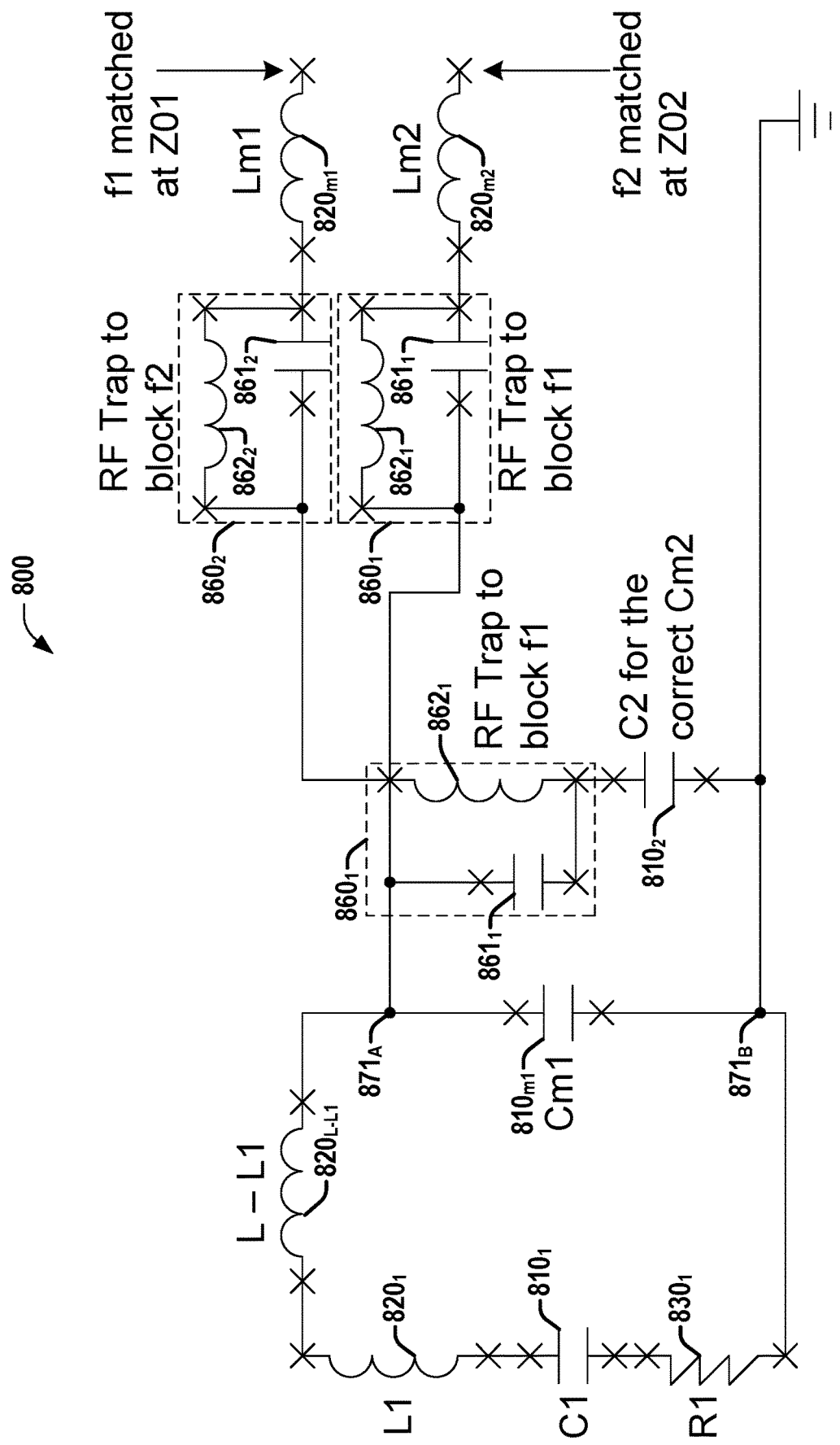
FIG. 8 is a diagram illustrating an example dual tune coil employing a single matching point, according to various aspects discussed herein.

Referring to FIG. 8, illustrated is a diagram of an example dual tune coil 800 employing a single matching point across nodes $871_A$ and $871_B$, according to various aspects discussed herein. In example dual-tune coil 800, capacitor $810_{m1}$ (e.g., with capacitance Cm1) with a first end at node $871_A$ and a second end at node $871_B$ (at ground), is the matching capacitor for frequency f1. The left "RF trap to block f1" $860_1$ (comprising appropriately valued capacitor $861_1$ and inductor $862_1$ arranged in parallel between the two nodes at either end of $860_1$, node $871_A$ and the unlabeled node shared with capacitor $810_2$) ensures that this additional branch comprising capacitor $810_2$ (e.g., with capacitance C2) is not part of the matching capacitance at f1. Additionally, although, for simplicity of illustration, a single design is shown for RF traps discussed herein, RF trap(s) of substantially any other configuration can be employed in various embodiments.

For a multi-tune coil with more than two frequencies, the additional branch between nodes $871_A$ and $871_B$ comprising capacitor $810_2$ and RF trap $860_1$ can, in some embodiments, comprise an RF trap for each frequency other than f2 (e.g., RF trap $860_3$ for f3, etc.), and the multi-tune coil can comprise similar additional branch(es) between nodes $871_A$ and $871_B$, each of which can comprise an appropriate capacitor $810_3$, etc. with value (e.g., C3, etc.) selected to obtain the correct matching capacitance (Cm3, as based on the values of C3 and Cm1 (of capacitor $810_{m1}$) in parallel, etc.) for the appropriate frequency and can also comprise RF traps for each frequency other than its associated frequency (e.g., RF trap $860_1$ for f1, RF trap $860_2$ for f2, etc.). An n-tune coil according to these embodiments can comprise n−1 such additional branches (each of which has n−1 RF traps $860_i$) to generate the n matching capacitances for the n frequencies (f1 to fn). Alternatively, in other embodiments, a lesser number of RF traps $860_i$ can be included, for example, in a triple-tune coil with a first additional branch to match f2 as in dual-tune coil 800 (e.g., not comprising a RF trap $860_3$ for f3), and a second additional branch to match f3 comprising RF traps $860_1$ for f1 and $860_2$ for f2 along with capacitor $810_3$ with value (e.g., C3, etc.) selected to obtain the correct matching capacitance (Cm3, as based on the values of C3 in parallel with Cm1 (of capacitor $810_{m1}$) and C2 (of capacitor $810_2$), etc.). An n-tune coil according to these embodiments can comprise n−1 additional branches (the first of which having 1 RF trap $860_1$, the second of which having 2 RF traps $860_1$ and $860_2$, etc., up to the (n−1)th of which having n−1 RF traps $860_i$) to generate the n matching capacitances for the n frequencies (f1 to fn).

Dual-tune coil 800 also comprises two matching branches, each of which comprises an associated matching impedance, which in example 800 are shown as the matching inductors $820_{m1}$ (with inductance Lm1) and $820_{m2}$ (with inductance Lm2), respectively. The upper of these matching branches (configured for transmitting and/or receiving of "f1 matched at Z01") also comprises a RF tank circuit (trap to block f2) $860_2$ in series with inductor $820_{m1}$, and the lower of these matching branches (configured for transmitting and/or receiving of "f2 matched at Z02") also comprises a RF tank circuit (trap to block f1) $860_1$ in series with inductor $820_{m2}$ (in a n-tune coil for n>2, each branch can comprise an associated tank circuit $860_i$ for each frequency other than the associated transmit and/or receive frequency of that matching branch). At f1, the "RF trap to block f2" $860_2$ (and similarly, $860_1$ in the lower matching branch) functions not as a trap but as reactive impedance. The impedance of $860_2$ can be capacitive or inductive, depending on which frequency (f1 or f2) is higher. The combined impedance of the "RF trap to block f2" $860_2$ and Lm1 (from $820_{m1}$) can be selected to be equal to the impedance of Cm1 and can be inductive (in n-tune coils with n>2, the combined impedance includes all tank circuits $860_i$ on that matching branch). Alternatively, the impedance shown in FIG. 8 as Lm1 from example inductor $820_{m1}$ can be capacitive (generated by a capacitor of appropriate value replacing inductor $820_{m1}$) if the trap inductance (from $860_2$, and, in n-tune embodiments with n>2, other tank circuits $860_i$) exceeds the relevant value on its own. The impedance "L-L1" of inductor $820_{L-L1}$ for f1 can have an impedance equal to Cm1. This matches the coil 800 to the impedance Z01 at f1. For f2, a similar analysis can be used to match the coil to the impedance Z02 at f2. For n-tune coils with n>2, another matching branch can be added, comprising appropriate RF traps $860i$ and associated matching impedance (e.g., from inductor $820_{mi}$, or a similarly arranged capacitor as appropriate), for each additional frequency (e.g., f3, f4, etc.).

Figure 9:
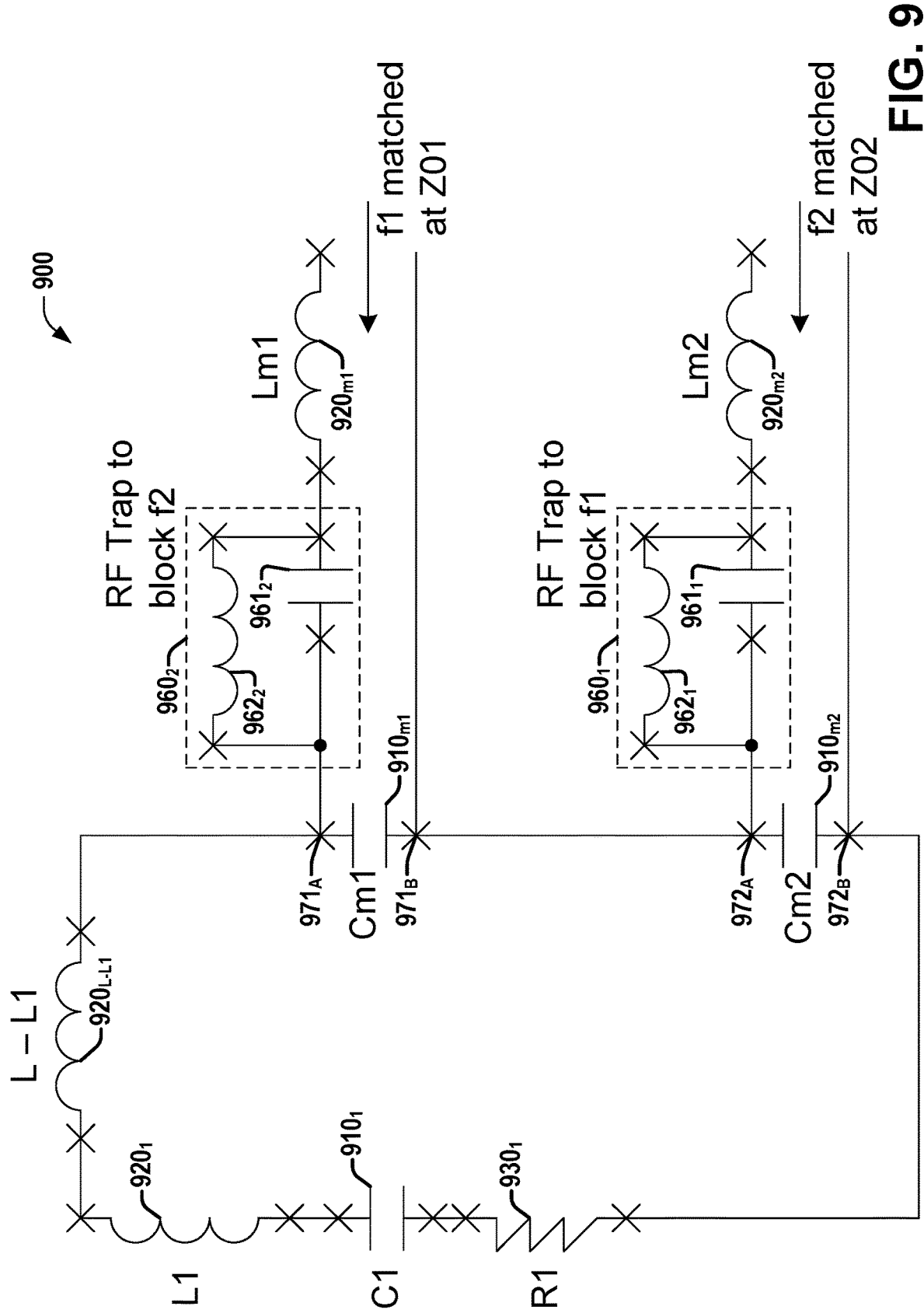
FIG. 9 is a diagram illustrating an example dual tune coil employing two matching points, according to various aspects discussed herein.

In other embodiments, instead of comprising a single matching point (at nodes $871_A$ and $871_B$) connected to two or more matching branches, a multi-tune coil can comprise multiple matching points that can each be connected to at least one matching branch. Referring to FIG. 9, illustrated is a diagram of an example dual tune coil 900 comprising two matching points (a first across nodes $971_A$ and $971_B$ and a second across nodes $972_A$ and $972_B$), according to various aspects discussed herein. Considering frequency f1, matching point capacitor $910_{m1}$ (with value Cm1) can be employed for f1, which can be matched via the upper matching branch. Matching point capacitor $910_{m2}$ (with value Cm2) and capacitor $910_1$ (with value C1) resonate with inductor $920_1$ (with value L1) as the coil resonance because "RF trap to block f1" $960_1$ isolates all f2 related electronics from coil. The combined impedance of RF trap $960_2$ and inductor (or capacitor, as discussed above in connection with FIG. 8) $920_{m1}$ (with value Lm1) can be set equal to Cm1 to match the coil to Z01 at f1. For f2, the same analysis can be applied to match the coil to Z02 at f2 (e.g., wherein the combined impedance of RF trap $960_1$ and inductor (or capacitor) $920_{m2}$ (with value Lm2) can be set equal to Cm2) on the lower matching branch. For n-tune coil embodiments with n>2, each matching point can be connected to an associated matching branch that comprise sufficient RF traps to block any frequencies not associated with that matching point, and additional frequencies (f3, etc.) can be matched via matching branch(es) connected to one or more additional matching points, one or more additional branches connected to existing matching point(s) (wherein one or more matching points comprise additional branches for individual frequencies as discussed in connection with FIG. 8, above), or a combination thereof (e.g., adding at least one matching branch to existing matching point(s), and at least one other matching branch to at least one additional matching point). Additionally, as noted above, although the circuits shown in FIG. 8 and FIG. 9 show one example of a "RF trap to block a frequency or frequencies," a variety of other circuits can also be employed to achieve the same or a similar effect, and such other circuits can be employed in various embodiments.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a magnetic resonance imaging (MRI) radio frequency (RF) coil multi-tune element comprising: At least one matching point, and the first matching branch with RF traps to block other frequencies except the first frequency, where the coil element is matched to the first predetermined impedance at the first frequency, and the second branch with RF traps to block other frequencies except the second frequency, where the coil element is matched to the second predetermined impedance at the second frequency, and more branches similar to the first and second to meet the number of the intended multi-tune.

A second example embodiment comprises a plurality of elements according to the first example embodiment that are put together to make an array coil.

A third example embodiment comprises the second example embodiment, wherein the array coil is one or more of a transmitter coil or a receiver coil.

The following examples are additional embodiments.

Example 1 is A magnetic resonance imaging (MRI) radio frequency (RF) multi-tune coil element configured to operate at two or more frequencies in at least one of a transmit (Tx) mode or a receive (Rx) mode, the MRI RF multi-tune coil element comprising: a LC coil comprising one or more matching capacitors and one or more matching points, wherein each matching point of the one or more matching points is across a different associated matching capacitor of the one or more matching capacitors; a first matching branch connected to the LC coil at an associated matching point of the one or more matching points, wherein the first matching branch comprises a first set of one or more RF traps configured to block each frequency of the two or more frequencies other than a first frequency of the two or more frequencies, wherein the first matching branch is configured to match to a first predetermined impedance at the first frequency; and a second matching branch connected to the LC coil at an associated matching point of the one or more matching points, wherein the second matching branch comprises a second set of one or more RF traps configured to block each frequency of the two or more frequencies other than a second frequency of the two or more frequencies, wherein the second matching branch is configured to match to a second predetermined impedance at the second frequency.

Example 2 comprises the subject matter of any variation of any of example(s) 1, wherein the one or more matching points comprise a first matching point and a different second matching point, wherein the first matching branch is connected to the LC coil at the first matching point, and wherein the second matching branch is connected to the LC coil at the second matching point.

Example 3 comprises the subject matter of any variation of any of example(s) 2, further comprising a third matching branch connected to the LC coil at a different third matching point of the one or more matching points, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 4 comprises the subject matter of any variation of any of example(s) 2, further comprising a third matching branch connected to the LC coil at one of the first matching point or the second matching point, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 5 comprises the subject matter of any variation of any of example(s) 1, wherein the one or more matching points comprise a first matching point, wherein the first matching branch is connected to the LC coil at the first matching point, and wherein the second matching branch is connected to the LC coil at the first matching point.

Example 6 comprises the subject matter of any variation of any of example(s) 5, further comprising a third matching branch connected to the LC coil at the first matching point, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 7 comprises the subject matter of any variation of any of example(s) 6, further comprising a first additional branch across the first matching point, wherein the first additional branch comprises a first additional capacitor and a first set of additional RF traps configured to block each frequency of the two or more frequencies other than the second frequency, wherein the first additional capacitor facilitates matching the second matching branch to the second predetermined impedance at the second frequency.

Example 8 comprises the subject matter of any variation of any of example(s) 7, further comprising a second additional branch across the first matching point, wherein the second additional branch comprises a second additional capacitor and a second set of additional RF traps configured to block each frequency of the two or more frequencies other than the third frequency, wherein the second additional capacitor facilitates matching the third matching branch to the third predetermined impedance at the third frequency.

Example 9 comprises the subject matter of any variation of any of example(s) 7, further comprising a second additional branch across the first matching point, wherein the second additional branch comprises a second additional capacitor and a second set of additional RF traps configured to block each frequency of the two or more frequencies other than the second frequency and the third frequency, wherein the second additional capacitor facilitates matching the third matching branch to the third predetermined impedance at the third frequency.

Example 10 comprises the subject matter of any variation of any of example(s) 1-9, wherein the first matching branch comprises one of a first matching inductor or a capacitor of the first matching branch, wherein the one of the first matching inductor or the capacitor of the first matching branch facilitates matching the first matching branch to the first predetermined impedance at the first frequency.

Example 11 comprises the subject matter of any variation of any of example(s) 1-10, wherein the second matching branch comprises one of a second matching inductor or a capacitor of the second matching branch, wherein the one of the second matching inductor or the capacitor of the second matching branch facilitates matching the second matching branch to the second predetermined impedance at the second frequency.

Example 12 is a MRI RF array coil comprising two or more different MRI RF multi-tune coils according to any variation of any of example(s) 1-11.

Example 13 is a magnetic resonance imaging (MRI) radio frequency (RF) multi-tune coil element configured to operate at two or more frequencies in at least one of a transmit (Tx) mode or a receive (Rx) mode, the MRI RF multi-tune coil element comprising: a LC coil comprising a first matching capacitor and a first matching point across the first matching capacitor; a first matching branch connected to the LC coil at the first matching point, wherein the first matching branch comprises a first set of one or more RF traps configured to block each frequency of the two or more frequencies other than a first frequency of the two or more frequencies, wherein the first matching branch is configured to match to a first predetermined impedance at the first frequency; and a second matching branch connected to the LC coil at the first matching point, wherein the second matching branch comprises a second set of one or more RF traps configured to block each frequency of the two or more frequencies other than a second frequency of the two or more frequencies, wherein the second matching branch is configured to match to a second predetermined impedance at the second frequency.

Example 14 comprises the subject matter of any variation of any of example(s) 13, further comprising a first additional branch across the first matching point, wherein the first additional branch comprises a first additional capacitor and a first set of additional RF traps configured to block each frequency of the two or more frequencies other than the second frequency, wherein the first additional capacitor facilitates matching the second matching branch to the second predetermined impedance at the second frequency.

Example 15 comprises the subject matter of any variation of any of example(s) 14, further comprising a third matching branch connected to the LC coil at the first matching point, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 16 comprises the subject matter of any variation of any of example(s) 15, further comprising a second additional branch across the first matching point, wherein the second additional branch comprises a second additional capacitor and a second set of additional RF traps configured to block each frequency of the two or more frequencies other than the second frequency and the third frequency, wherein the second additional capacitor facilitates matching the third matching branch to the third predetermined impedance at the third frequency.

Example 17 comprises the subject matter of any variation of any of example(s) 13-14, further comprising a third matching branch connected to the LC coil at a different second matching point of the one or more matching points, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 18 is a magnetic resonance imaging (MRI) radio frequency (RF) multi-tune coil element configured to operate at two or more frequencies in at least one of a transmit (Tx) mode or a receive (Rx) mode, the MRI RF multi-tune coil element comprising: a LC coil comprising two or more matching capacitors and two or more matching points, wherein each matching point of the two or more matching points is across a different associated matching capacitor of the two or more matching capacitors; a first matching branch connected to the LC coil at a first matching point of the two or more matching points, wherein the first matching branch comprises a first set of one or more RF traps configured to block each frequency of the two or more frequencies other than a first frequency of the two or more frequencies, wherein the first matching branch is configured to match to a first predetermined impedance at the first frequency; and a second matching branch connected to the LC coil at a second matching point of the two or more matching points, wherein the second matching point is different than the first matching point, wherein the second matching branch comprises a second set of one or more RF traps configured to block each frequency of the two or more frequencies other than a second frequency of the two or more frequencies, wherein the second matching branch is configured to match to a second predetermined impedance at the second frequency.

Example 19 comprises the subject matter of any variation of any of example(s) 18, further comprising a third matching branch connected to the LC coil at one of the first matching point or the second matching point, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 20 comprises the subject matter of any variation of any of example(s) 18, further comprising a third matching branch connected to the LC coil at third matching point of the two or more matching points, wherein the third matching point is different from the first matching point and the second matching point, wherein the third matching branch comprises a third set of one or more RF traps configured to block each frequency of the two or more frequencies other than a third frequency of the two or more frequencies, wherein the third matching branch is configured to match to a third predetermined impedance at the third frequency.

Example 21 is a MRI apparatus comprising a MRI RF coil according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) multi-tune coil element configured to operate at two or more frequencies in at least one of a transmit (Tx) mode or a receive (Rx) mode, the MRI RF multi-tune coil element comprising:
a coil comprising one or more capacitors and one or more inductors electrically coupled in a loop, and further comprising one or more matching points on the loop, wherein the one or more capacitors comprises one or more matching capacitors, wherein the one or more inductors comprises a coil trace inductor, and wherein each matching point of the one or more matching points is across a different associated matching capacitor of the one or more matching capacitors;
a first matching branch connected to the coil at an associated matching point of the one or more matching points, wherein the first matching branch comprises a first set of one or more RF traps configured to block each frequency of the two or more frequencies other than a first frequency of the two or more frequencies, and wherein the first matching branch is configured to match to a first predetermined impedance at the first frequency; and a second matching branch connected to the coil at an associated matching point of the one or more matching points, wherein the second matching branch comprises a second set of one or more RF traps configured to block each frequency of the two or more frequencies other than a second frequency of the two or more frequencies, and wherein the second matching branch is configured to match to a second predetermined impedance at the second frequency;

wherein the associated matching point at which the first matching branch is connected to the coil is across a first matching capacitor of the one or more matching capacitors, wherein the first matching branch has a combined impedance that is a same as an impedance of the first matching capacitor at the first frequency, wherein the first matching branch, the first matching capacitor, and the coil trace inductor collectively create a first quarter wavelength transmission line at the first frequency that translates parasitic resistance of the coil to the first predetermined impedance at an output of the first quarter wavelength transmission line, and wherein the first and second predetermined impedances are different.

2. The MRI RF multi-tune coil element of claim 1, wherein the one or more matching points comprise a first matching point and a second matching point different than the first matching point, wherein the first matching branch is connected to the coil at the first matching point, and wherein the second matching branch is connected to the coil at the second matching point.

3. The MRI RF multi-tune coil element of claim 1, wherein the one or more matching points comprise a first matching point, wherein the first matching branch is connected to the coil at the first matching point, and wherein the second matching branch is connected to the coil at the first matching point.

4. The MRI RF multi-tune coil element of claim 3, further comprising:

a third set of one or more RF traps configured to block each frequency of the two or more frequencies other than the second frequency; and a correction capacitor;

wherein the first matching point is arranged across the first matching capacitor, wherein the third set of one or more RF traps and the correction capacitor are electrically coupled in series and are distinct from the first and second matching branches and the coil, wherein a series combination of the third set of one or more RF traps and the correction capacitor is electrically coupled in parallel with the first matching capacitor, and wherein a combined impedance of the first matching capacitor and the series combination at the second frequency is a same as a combined impedance of the second matching branch at the second frequency.

5. The MRI RF multi-tune coil element of claim 1, wherein the first matching branch comprises one of a first matching inductor or a capacitor of the first matching branch, wherein the one of the first matching inductor or the capacitor of the first matching branch facilitates matching the first matching branch to the first predetermined impedance at the first frequency.

6. The MRI RF multi-tune coil element of claim 1, wherein the second matching branch comprises one of a second matching inductor or a capacitor of the second matching branch, wherein the one of the second matching inductor or the capacitor of the second matching branch facilitates matching the second matching branch to the second predetermined impedance at the second frequency.

7. A MRI RF array coil comprising two or more different MRI RF multi-tune coil elements according to claim 1.

8. The MRI RF multi-tune coil element according to claim 1, wherein the one or more capacitors and the one or more inductors are electrically coupled in series in the loop, which extends in a closed path.

9. The MRI RF multi-tune coil element according to claim 1, wherein the first matching branch comprises a capacitor or inductor electrically coupled in series with the first set of one or more RF traps from a node shared with the first matching capacitor to an output node separated from the coil by the first matching branch.

10. The MRI RF multi-tune coil element according to claim 9, wherein the first matching branch consists of the capacitor or inductor and the first set of one or more RF traps.

11. The MRI RF multi-tune coil element of claim 1, wherein the associated matching point at which the second matching branch is connected to the coil is across a second matching capacitor of the one or more matching capacitors, wherein the second matching capacitor has a different capacitance than the first matching capacitor, and wherein the second matching branch has a combined impedance that is a same as an impedance of the second matching capacitor at the second frequency.

12. A magnetic resonance imaging (MRI) radio frequency (RF) multi-tune coil element configured to operate at two or more frequencies in at least one of a transmit (Tx) mode or a receive (Rx) mode, the MRI RF multi-tune coil element comprising:

a coil comprising one or more capacitors and one or more inductors, and further comprising a first matching point, wherein the one or more capacitors comprises a first matching capacitor, wherein the one or more inductors comprises a coil trace inductor, and wherein the first matching point is across the first matching capacitor;

a first matching branch connected to the coil at the first matching point, wherein the first matching branch comprises a first set of one or more RF traps configured to block each frequency of the two or more frequencies other than a first frequency of the two or more frequencies, and wherein the first matching branch is configured to match to a first predetermined impedance at the first frequency;

a second matching branch connected to the coil at the first matching point, wherein the second matching branch comprises a second set of one or more RF traps configured to block each frequency of the two or more frequencies other than a second frequency of the two or more frequencies, and wherein the second matching branch is configured to match to a second predetermined impedance at the second frequency;

a third set of one or more RF traps configured to block each frequency of the two or more frequencies other than the second frequency; and a correction capacitor;

wherein the third set of one or more RF traps and the correction capacitor are electrically coupled in series and are distinct from the first and second matching branches and the coil, wherein a series combination of the third set of one or more RF traps and the correction capacitor is electrically coupled in parallel with the first matching capacitor, wherein the first matching branch, the first matching capacitor, and the coil trace inductor collectively create a first quarter wavelength transmission line at the first frequency that translates parasitic resistance of the coil to the first predetermined impedance at an output of the first quarter wavelength transmission line, and wherein the first and second predetermined impedances are different.

13. The MRI RF multi-tune coil element of claim 12, wherein the second matching branch has a combined impedance at the second frequency that is a same as a combined impedance of the first matching capacitor, the correction capacitor, and the third set of one or more RF traps at the second frequency.

14. The MRI RF multi-tune coil element of claim 13, wherein the first matching branch has a combined impedance at the first frequency that is a same as an impedance of the first matching capacitor at the first frequency.

15. The MRI RF multi-tune coil element of claim 12, wherein the one or more capacitors and the one or more inductors are electrically coupled in series in a loop, which extends in a closed path.

16. The MRI RF multi-tune coil element of claim 12, wherein the first matching branch consists of a first reactive element electrically coupled in series with the first set of one or more RF traps from a shared node to a first output for the first frequency, wherein the second matching branch consists of a second reactive element electrically coupled in series with the second set of one or more RF traps from the shared node to a second output for the second frequency, and wherein a first terminal of the first matching capacitor is electrically shorted to the shared node.

17. A magnetic resonance imaging (MRI) radio frequency (RF) multi-tune coil element configured to operate at two or more frequencies in at least one of a transmit (Tx) mode or a receive (Rx) mode, the MRI RF multi-tune coil element comprising:
 a coil comprising one or more capacitors and one or more inductors, and further comprising two or more matching points, wherein the one or more capacitors comprises two or more matching capacitors, wherein the one or more inductors comprises a coil trace inductor, and wherein each matching point of the two or more matching points is across a different associated matching capacitor of the two or more matching capacitors;
 a first matching branch connected to the coil at a first matching point of the two or more matching points, wherein the first matching branch comprises a first set of one or more RF traps configured to block each frequency of the two or more frequencies other than a first frequency of the two or more frequencies, and wherein the first matching branch is configured to match to a first predetermined impedance at the first frequency; and
 a second matching branch connected to the coil at a second matching point of the two or more matching points, wherein the second matching point is different than the first matching point, wherein the second matching branch comprises a second set of one or more RF traps configured to block each frequency of the two or more frequencies other than a second frequency of the two or more frequencies, and wherein the second matching branch is configured to match to a second predetermined impedance at the second frequency;
 wherein the first matching point is across a first matching capacitor of the one or more matching capacitors, wherein the first matching branch, the first matching capacitor, and the coil trace inductor collectively create a first quarter wavelength transmission line at the first frequency that translates parasitic resistance of the coil to the first predetermined impedance at an output of the first quarter wavelength transmission line, and wherein the first and second predetermined impedances are different.

18. The MRI RF multi-tune coil element according to claim 17, wherein the second matching point is across a second matching capacitor of the one or more matching capacitors, wherein the second matching branch, the second matching capacitor, and the coil trace inductor collectively create a second quarter wavelength transmission line at the second frequency that translates the parasitic resistance of the coil to the second predetermined impedance at an output of the second quarter wavelength transmission line.

19. The MRI RF multi-tune coil element according to claim 18, wherein the coil trace inductor is equivalent to a first inductor and a second inductor electrically coupled in series, wherein the first inductor resonates with the one or more capacitors, less the first matching capacitor, at the first frequency, and wherein the second inductor has a same impedance as the first matching capacitor at the first frequency.

20. The MRI RF multi-tune coil element according to claim 17, wherein the second matching point is across a second matching capacitor of the one or more matching capacitors, wherein a combined impedance of the first matching branch equals an impedance of the first matching capacitor, and wherein a combined impedance of the second matching branch equals an impedance of the second matching capacitor.

* * * * *